(12) United States Patent
Kuiseko et al.

(10) Patent No.: US 7,372,079 B2
(45) Date of Patent: May 13, 2008

(54) SURFACE LIGHT EMITTER, DISPLAY APPARATUS AND LIGHT CONTROL MEMBER

(75) Inventors: Manami Kuiseko, Kyoto (JP); Akira Sato, Ritto (JP); Shigeto Ohmori, Kawachinagano (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 11/656,273

(22) Filed: Jan. 22, 2007

(65) Prior Publication Data

US 2007/0176195 A1    Aug. 2, 2007

(30) Foreign Application Priority Data

Jan. 31, 2006  (JP)  ............................. 2006-022275
Nov. 30, 2006  (JP)  ............................. 2006-323346

(51) Int. Cl.
*H01L 29/22* (2006.01)

(52) U.S. Cl. .................. 257/98; 257/432; 257/434; 257/E31.127; 359/435; 359/618; 359/831; 359/837

(58) Field of Classification Search ............... None
See application file for complete search history.

(56) References Cited

U.S. PATENT DOCUMENTS 6,239,851 B1 * 5/2001 Hatazawa et al. ............ 349/62
2004/0036990 A1 * 2/2004 Hanano ...................... 359/831

FOREIGN PATENT DOCUMENTS

JP    05-045505    2/1993
JP    09-063767    3/1997

* cited by examiner

*Primary Examiner*—A. Sefer
*Assistant Examiner*—Scott R. Wilson
(74) *Attorney, Agent, or Firm*—Brinks Hofer Gilson & Lione

(57) ABSTRACT

To improve the front brightness of the light emitted from a surface light emitter having a surface light emitting device. In the surface light emitter to which a light control sheet having depressions is provided, the surface of the light control sheet having the depressions is adhered to a light emitting side surface of a surface light emitting device, and the transparent material whose refractive index is lower than the refractive index of the light control sheet is arranged in the spaces formed between the depressions and the light emitting side surface of the surface light emitting device.

16 Claims, 23 Drawing Sheets

FIG. 10 (A-1)   FIG. 10 (B-1)   FIG. 10 (C-1)   FIG. 10 (D-1)
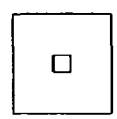 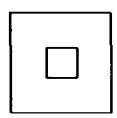 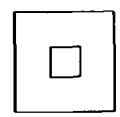 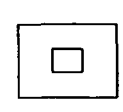
FIG. 10 (A-2)   FIG. 10 (B-2)   FIG. 10 (C-2)   FIG. 10 (D-2)
  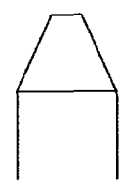 
FIG. 10 (E-1)   FIG. 10 (F-1)   FIG. 10 (G-1)   FIG. 10 (H-1)
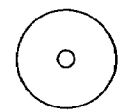 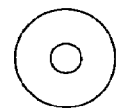 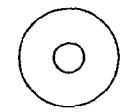 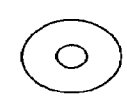
FIG. 10 (E-2)   FIG. 10 (F-2)   FIG. 10 (G-2)   FIG. 10 (H-2)
   

SURFACE LIGHT EMITTER, DISPLAY APPARATUS AND LIGHT CONTROL MEMBER

This application is based on Japanese Patent Application No. 2006-022275 filed on Jan. 31, 2006, and No. 2006-323346 filed on Nov. 30, 2006, in Japanese Patent Office, the entire content of which is hereby incorporated by reference.

TECHNICAL FIELD

This invention relates to a surface light emitter provided with a surface light emitting device, display apparatus, and light control member.

BACKGROUND

In recent years, due to the increasing diversification of information technology equipment, there is an increasing need for surface light emitting devices with low power consumption and small volume, and electroluminescent devices (hereinafter abbreviated as EL devices) which are one such surface light emitting devices are attracting a lot of attention.

Such EL devices are broadly classified into inorganic EL devices and organic EL devices depending on types of material used in them.

Further, in case of inorganic EL devices, generally a high electric field is applied to the light emitting section, and electrons collide with light emission centers being accelerated by that high electric field, thus the light emission centers are excited and cause the emission of light. On the other hand, in case of organic EL devices, electrons and holes are injected respectively from the electron injection electrode and hole injection electrode into the light emission layer, the organic material get into an excited state, and the emission of light is caused when this organic material returns from the excited state to the ground state. And organic EL devices have the advantage that they are capable of being driven at a lower voltage than the inorganic EL devices.

Further, in the case of organic EL devices, it is possible to obtain light emitting devices that emit light with the appropriate color tone by selecting appropriate light emitting materials, it is also possible to obtain white light by suitably combining the light emitting materials, and hence they can be expected to be used as the back light for liquid crystal display devices, etc.

Further, when used as the backlight for liquid crystal display devices, etc., usually a front brightness of 2000 to 4000 cd/m$^2$ is required. But when light is emitted using a surface light emitting device such as the above EL device, etc., the emitted light travels in all directions, and a lot of light is totally reflected at the light emitting side surface of the surface light emitting device and is kept in the interior of the device and hence it is difficult to obtain sufficient front brightness. And particularly in the case of organic EL devices, there was the problem that in order to obtain sufficient light emission life it was only possible to obtain a front luminosity of about 1000 to 1500 cd/m$^2$.

Further, conventionally, when light is emitted from a surface light emitting device such as an organic EL device, in order to improve its front brightness, proposals have been made to provide minute undulations in the light emitting surface of the surface light emitting device (see, for example, Japanese Laid-Open Patent Publication No. H9-63767), or to the affix a flat member provided with undulations on the light emitting side surface of the surface light emitting device so that these undulations appear on the surface (see, for example, Japanese Laid-Open Patent Publication No. H5-45505).

However, if, in the above manner, minute undulations are provided on the light emitting surface of surface light emitting devices, or if a flat member provided with undulations is affixed on the light emitting surface of the surface light emitting device so that these undulations appear on the surface, there was the problem that light got scattered due to the undulations on the surface and it was not yet possible to sufficiently increase the front luminosity.

SUMMARY

Therefore, an object of the present invention is to provide a light control member, a surface light emitter and a display apparatus by which the front brightness of the light emitted from the light emitter is largely improved.

In view of forgoing, one embodiment according to one aspect of the present invention is a surface light emitter, comprising:

a surface light emitting device which has a light emitting side surface, through which the surface light emitting device emits light; and a light control sheet which has a flat surface which is spaced out with a plurality of depressions, the light control sheet being mounted on the light emitting device with the flat surface having the depressions bonded to the light emitting side surface, wherein transparent material is filled in spaces between the depressions and the light emitting side surface, a refractive index of the transparent material being lower than a refraction index of the light control sheet.

According to another aspect of the present invention, another embodiment is a display apparatus, comprising:

a transmissive display device; and a surface light emitter, the surface light emitter including:

a surface light emitting device which has a light emitting side surface, through which the surface light emitting device emits light; and a light control sheet which has a flat surface which is spaced out with a plurality of depressions, the light control sheet being mounted on the light emitting device with the flat surface having the depressions bonded to the light emitting side surface, wherein transparent material is filled in spaces between the depressions and the light emitting side surface, a refractive index of the transparent material being lower than a refraction index of the light control sheet, and the surface light emitter functions as a backlight.

According to another aspect of the present invention, another embodiment is a display apparatus, comprising:

a surface light emitting device which has a matrix of a plurality of pixels arranged in a plane for emitting light;

a light control sheet which has a flat surface which is spaced out with a plurality of depressions, the light control sheet being mounted on the light emitting device with the flat surface having the depressions bonded to the light emitting side surface, wherein transparent material is filled in spaces between the depressions and the light emitting side surface, a refractive index of the transparent material being lower than a refraction index of the light control sheet.

According to another aspect of the present invention, another embodiment is a light control member, comprising:

a light control sheet which has a flat surface which is spaced out with a plurality of depressions; and transparent material which is filled in the depressions to make a flat surface, a refractive index of the transparent material being lower than a refractive index of the light control sheet.

According to another aspect of the present invention, another embodiment is a surface light emitter, comprising:

a surface light emitting device which has a light emitting side surface, through which the surface light emitting device emits light; and a light control member, the light control member including:

a light control sheet which has a flat surface which is spaced out with a plurality of depressions, the light control sheet being mounted on the light emitting device with the flat surface having the depressions bonded to the light emitting side surface; and transparent material which is filled in spaces between the depressions and the light emitting side surface for making a flat surface, a refractive index of the transparent material being lower than a refraction index of the light control sheet.

BRIEF DESCRIPTION OF THE DRAWINGS

FIGS. 10(A-1), 10(B-1), 10(C-1), 10(D-1), 10(E-1), 10(F-1), 10(G-1) and 10(H-1) are plan views of a punch which can be used when the light control sheet according to the present invention is manufactured.

FIGS. 10(A-2), 10(B-2), 10(C-2), 10(D-2), 10(E-2), 10(F-2), 10(G-2) and 10(H-2) are side views of the punch of FIGS. 10(A-1), 10(B-1), 10(C-1), 10(D-1), 10(E-1), 10(F-1), 10(G-1) and 10(H-1) respectively.

DETAILED DESCRIPTION OF THE PREFERRED EMBODIMENT

Next, the surface light emitter according to an embodiment of the present invention will be described specifically based on the attached drawings. Hereupon, the surface light emitter according to the present invention is not limited to one shown in the following embodiments, and in the scope in which the spirit is not changed, it can be appropriately changed and carried out. In the present specification, in order to be easily understood, the vertical direction viewed from the user, when the surface light emitter is used, will be called Y direction, the horizontal direction perpendicular to the Y direction will be called X direction.

Embodiment 1

Figure 1A:
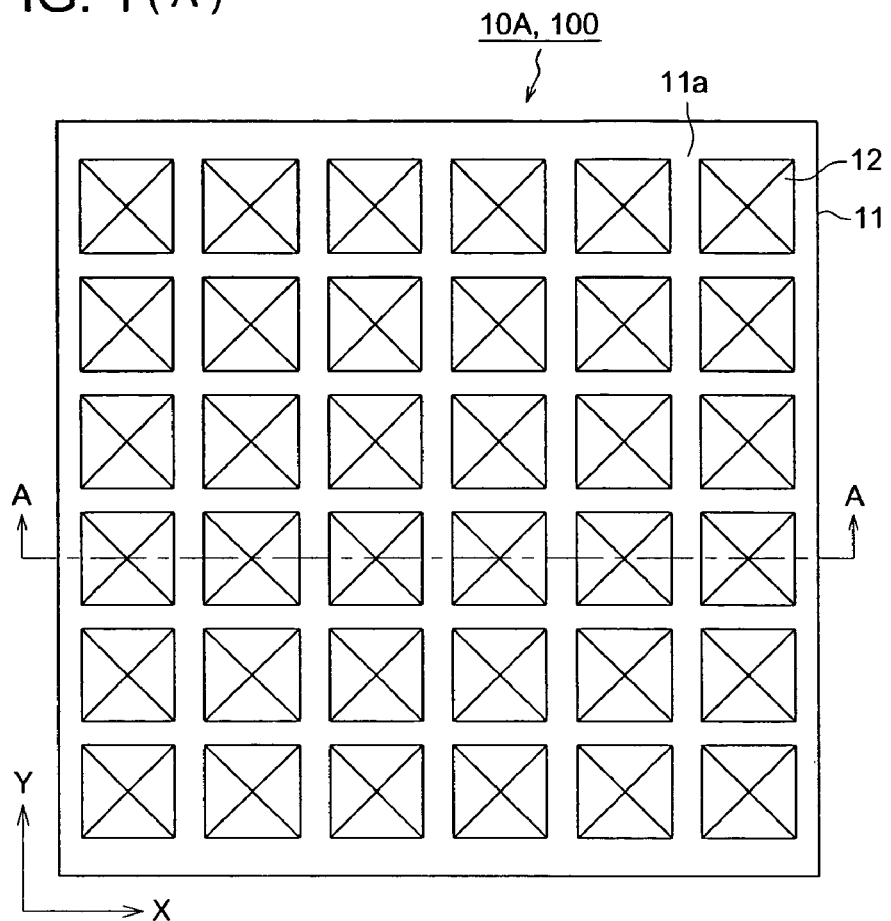
FIG. 1(A) is a plan view of the opposite side to an light emitting side surface of the light control sheet used for the surface light emitter according to an embodiment 1.
Figure 1B:
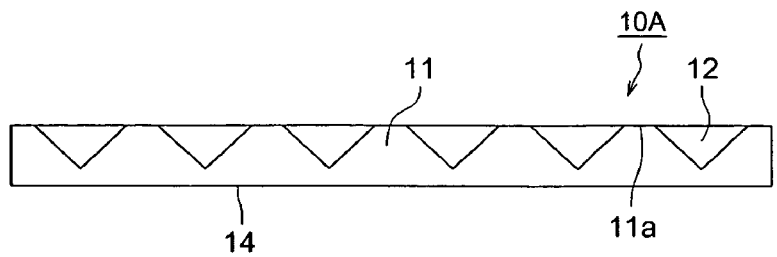
FIGS. 1(B) and 1(C) are cross section view of the light control sheet of FIG. 1(A) along the line A-A.

In the first embodiment of the present invention, as a light control sheet shown in FIGS. 1(A) and 1(B), a prism array sheet 10A in which square pyramid like depressions 12 are vertically and horizontally continuously formed on one surface of a transparent substrate 11 is used. In this case, the sectional shape of the depression is the shape of triangle as shown in FIG. 1(B).

Figure 2:
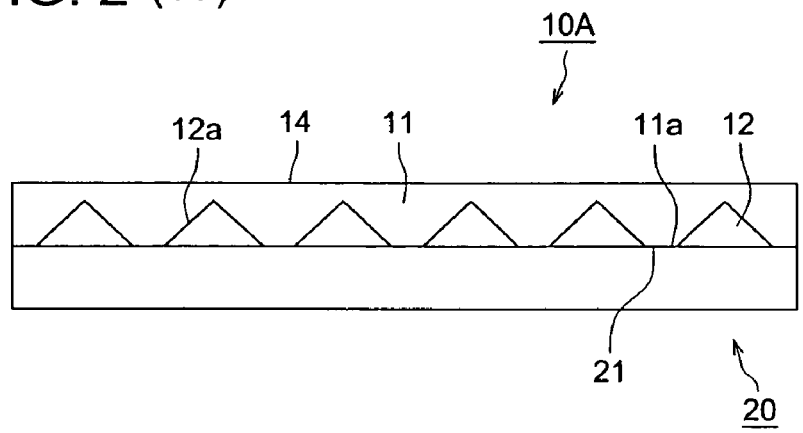
FIGS. 2(A) and 2(B) are general cross section views showing the surface light emitter according to the embodiment 1 of the present invention.
Figure 2:
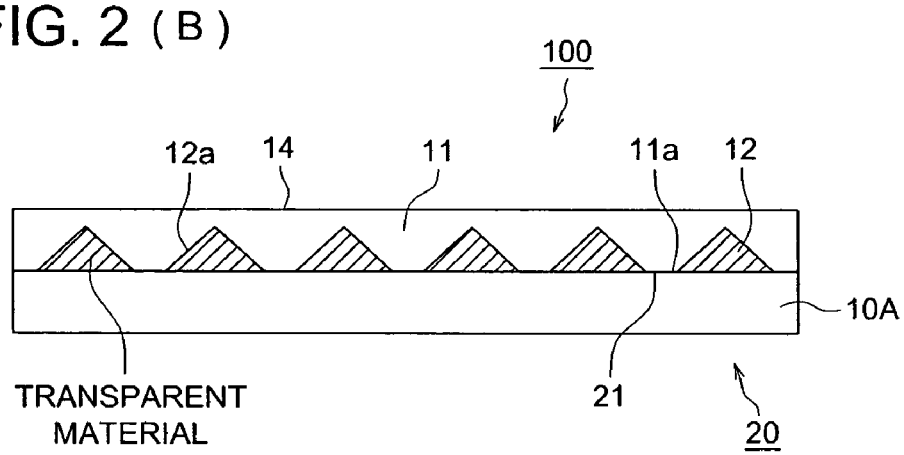

Then, in the surface light emitter of the present embodiment 1, as shown in FIG. 2(A), the surface, on which the square pyramid like depressions 12 in the above prism array sheet 10A are formed, is adhered to an light emitting side surface 21 of the light emitting device 20 of an organic electro-luminescence element, in which an organic layer including the light emitting layer is provided between the transparent substrate having a transparent electrode and an opposing electrode.

When the surface, on which the square pyramid like depressions 12 in the above prism array sheet 10A are formed, is adhered to an light emitting side surface 21 of the light emitting device 20, the air is arranged between the depressions 12 of the prism array sheet 10A and the light emitting side surface 21 of the surface light emitting device 20 as transparent material whose refractive index is lower than the prism array sheet 10A. When the air is used as the transparent material whose refractive index is lower than the prism array sheet 10A, the are is preferable material in a point that it can be arranged without being tightly shielded like liquid and can be processed in the air without a special process.

Figure 1C:
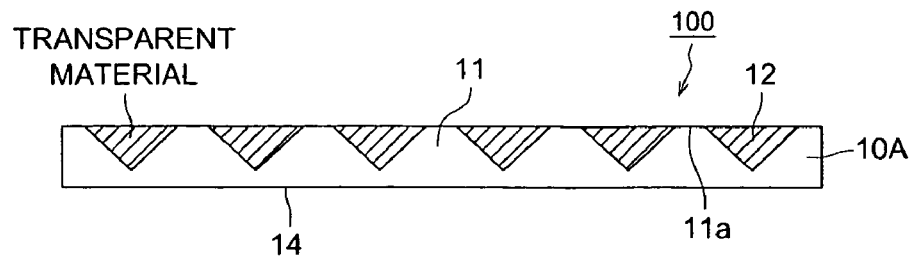

Further, as the transparent material, needed is just a material whose refractive index is lower than the refractive index of the light control sheet, and the liquid such as emersion oil or ultraviolet curable resin can be used. When material other than the air is used as the transparent material 12 as shown in FIG. 1(C), the transparent material whose refractive index is lower than the light control sheet is filled in the depression of the light control sheet 10A to make a flat surface.

When the ultraviolet curable resin is used as the transparent material whose refractive index is lower than the light control sheet, it is easy to handle because it can be hardened by the ultraviolet ray after filling.

The light control member 100 made in such a manner may be adhered so that, as shown in FIG. 2(B), the transparent material filled in the depression of the light control member is closely contacted to the light emitting side surface of the surface light emitting device.

Figure 3:
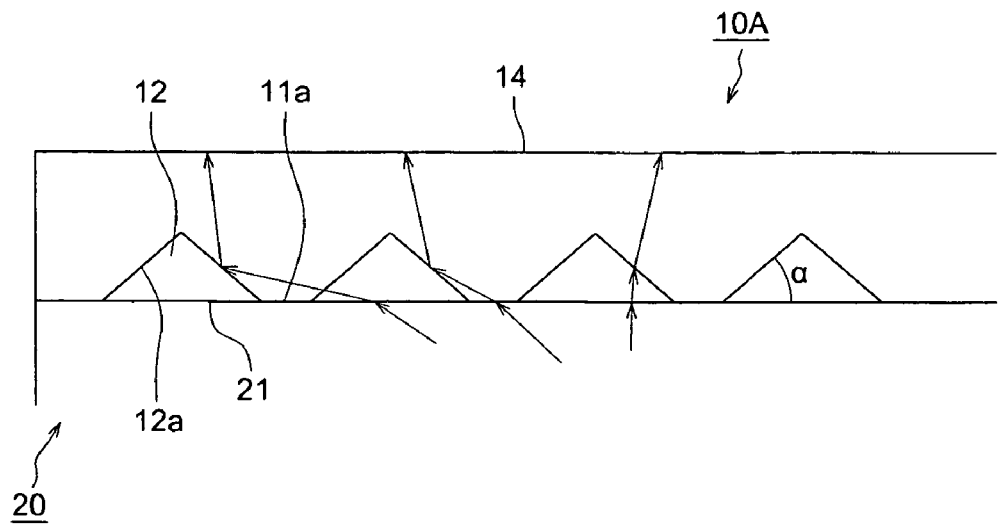
FIG. 3 is a partial enlargement explain view of the surface light emitting device according to the embodiment 1 of the present invention.
Figure 4:
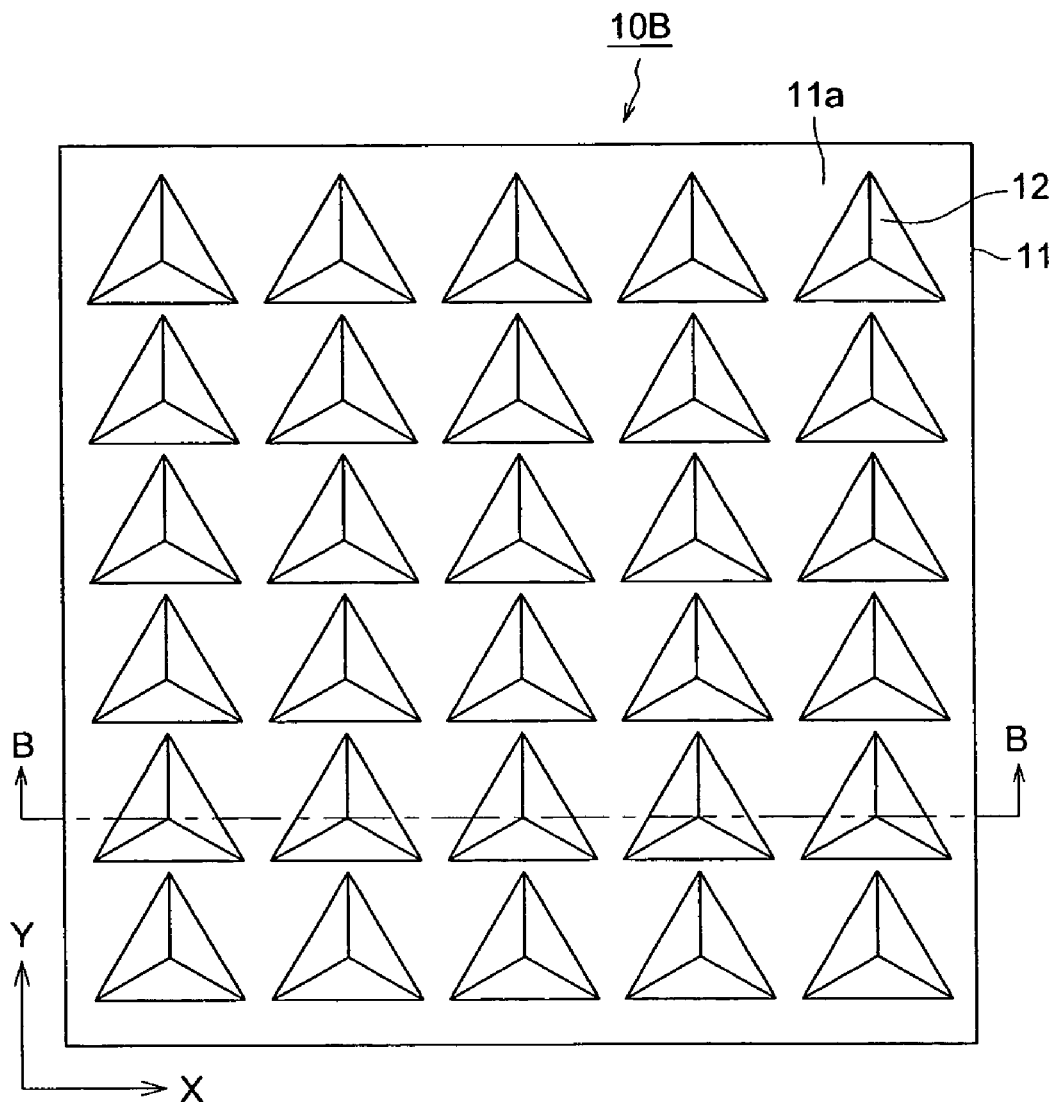
FIG. 4(A) is a plan view of the opposite side to the light emitting side surface of the light control sheet used for the surface light emitter according to the present invention.
FIG. 4(B) is a cross section view of the light control sheet of FIG. 4(A) along the line B-B.
Figure 4:
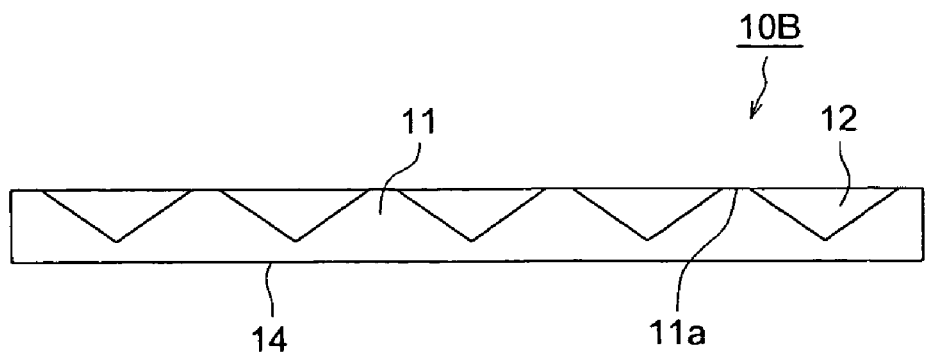
Figure 5:
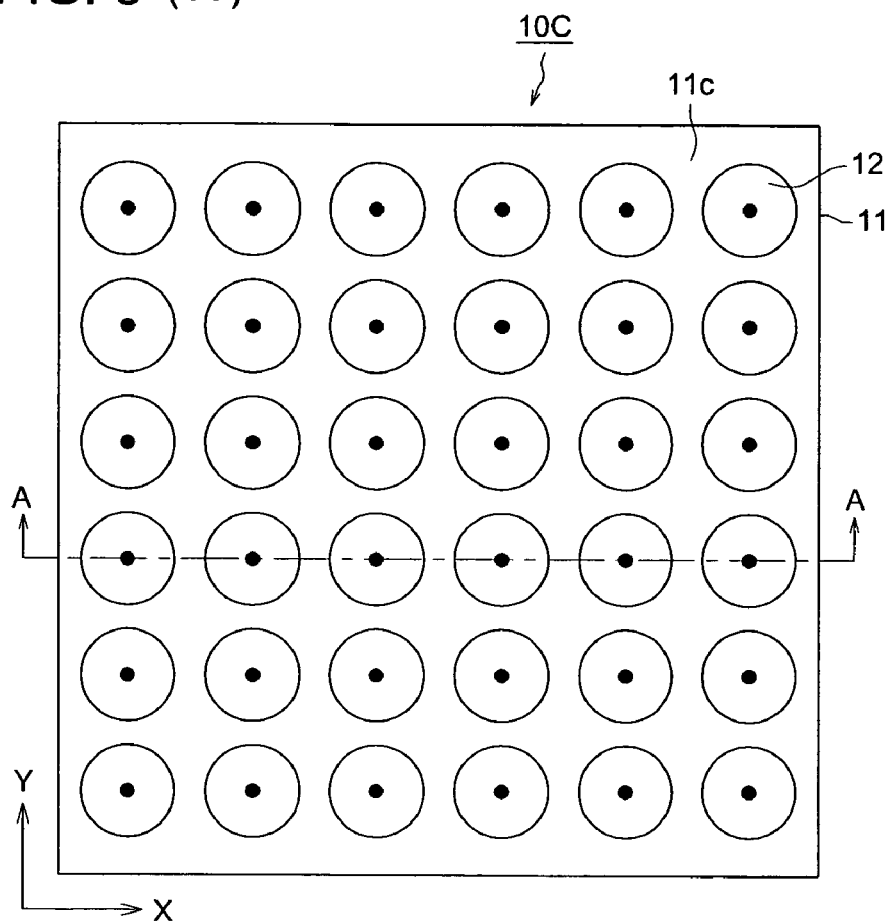
FIG. 5(A) is a plan view of the opposite side to the light emitting side surface of the light control sheet used for the surface light emitter according to an embodiment 2 of the present invention.
FIGS. 5(B) and 5(C) are cross section views of the light control sheet of FIG. 5(A) along the line A-A.
Figure 5:
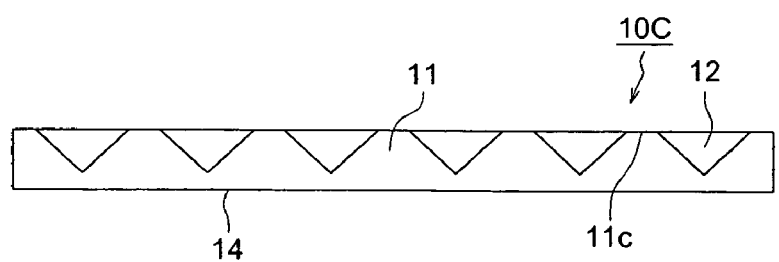
Figure 5:
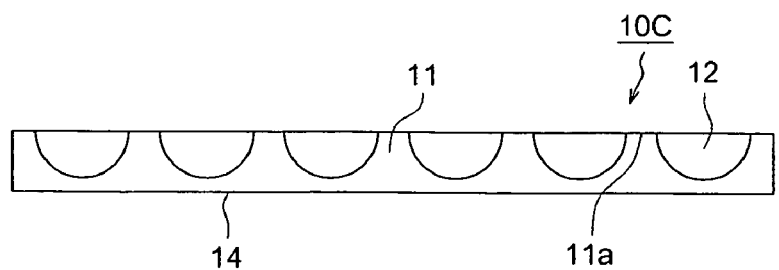
Figure 6:
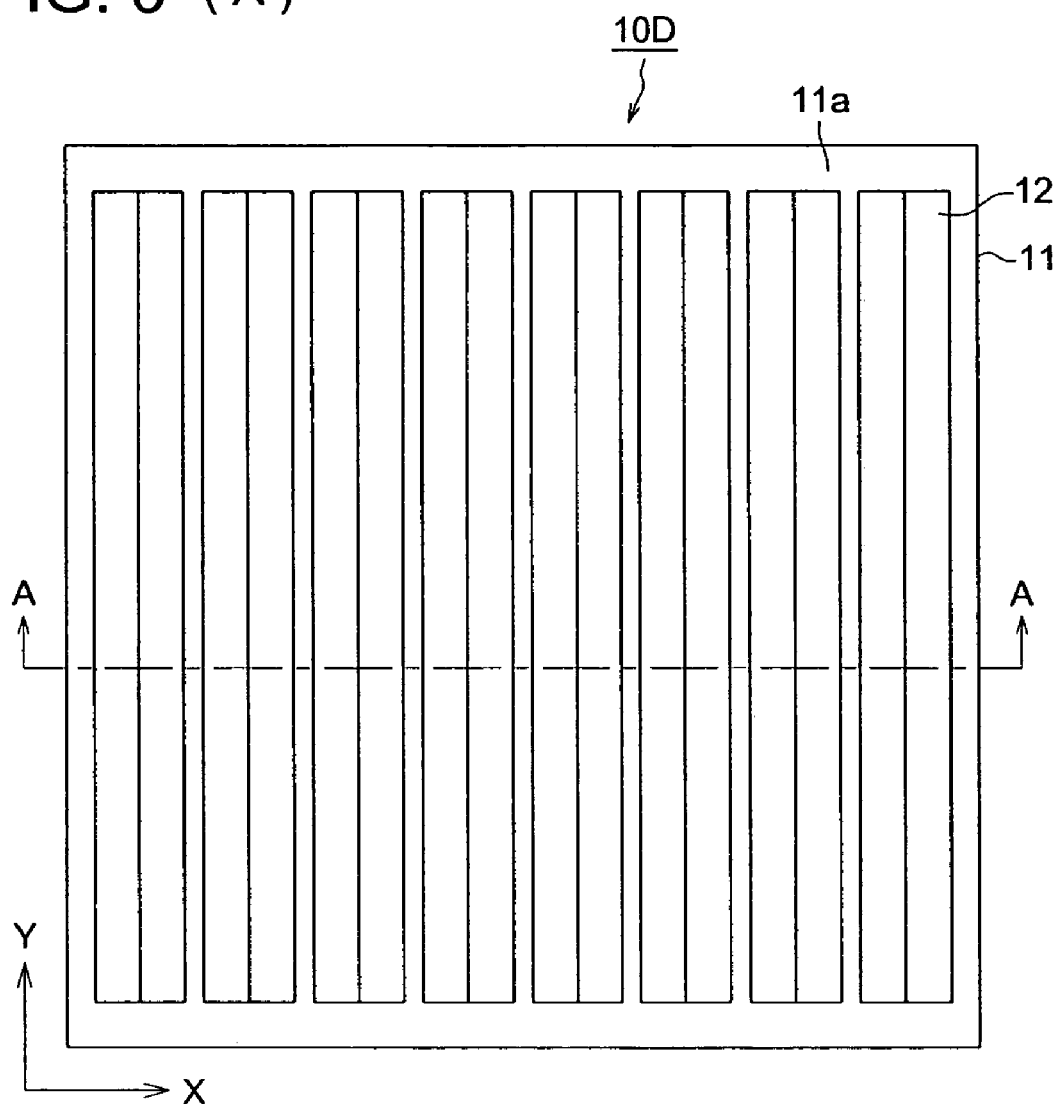
FIG. 6(A) is a plan view of the opposite side to the light emitting side surface of the light control sheet used for the surface light emitter according to the present invention.
FIG. 6(B) is a cross section view of the light control sheet of FIG. 6(A) along the line A-A.
Figure 6:
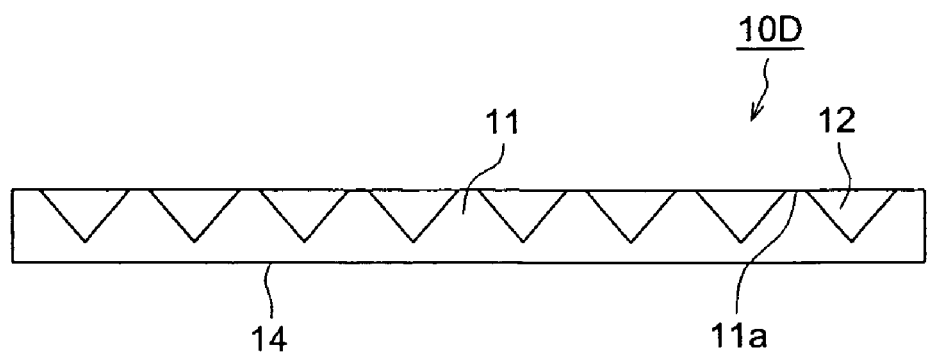
Figure 7:
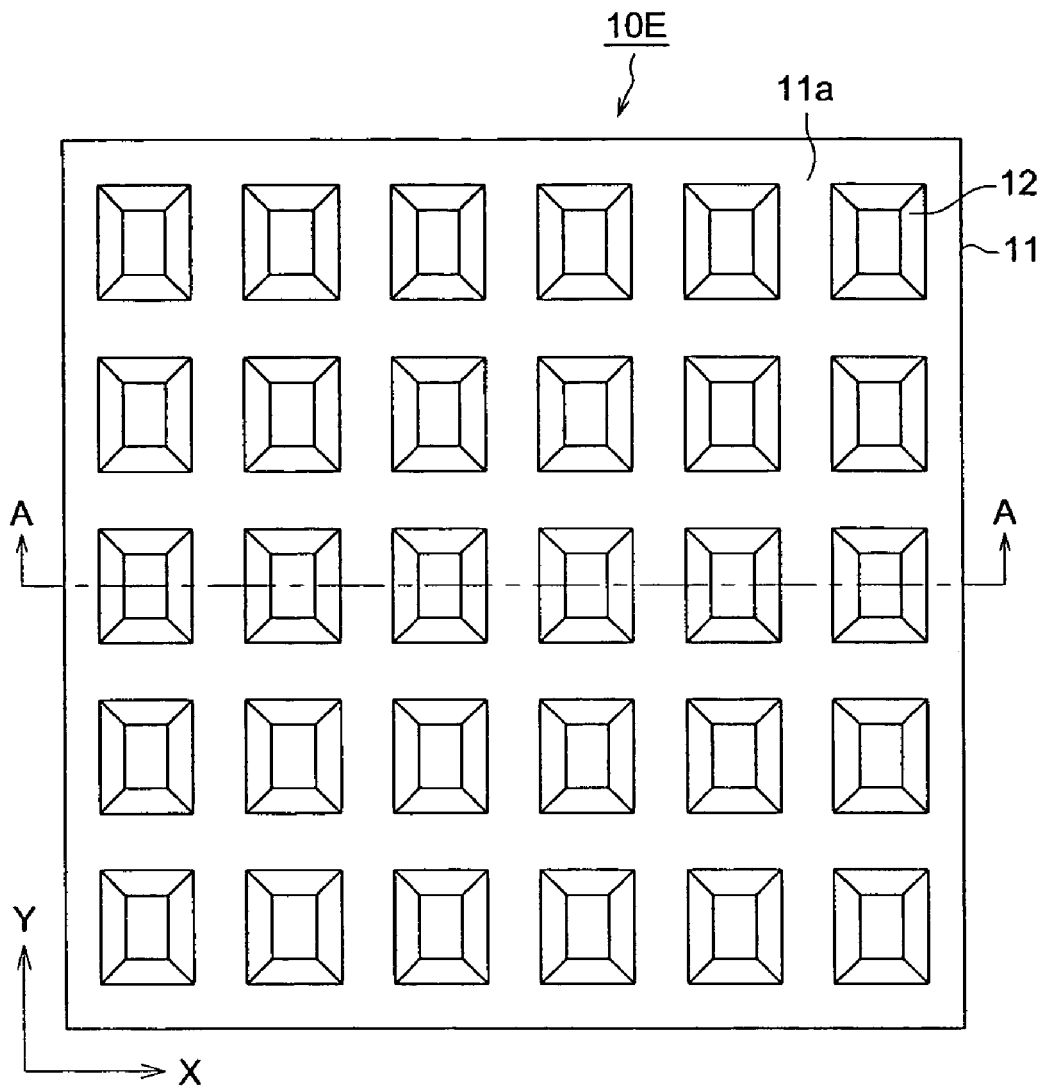
FIG. 7(A) is a plan view of the opposite side to the light emitting side surface of the light control sheet used for the surface light emitter according to the present invention.
FIG. 7(B) is a cross section view of the light control sheet of FIG. 7(A) along the line A-A.
Figure 7:
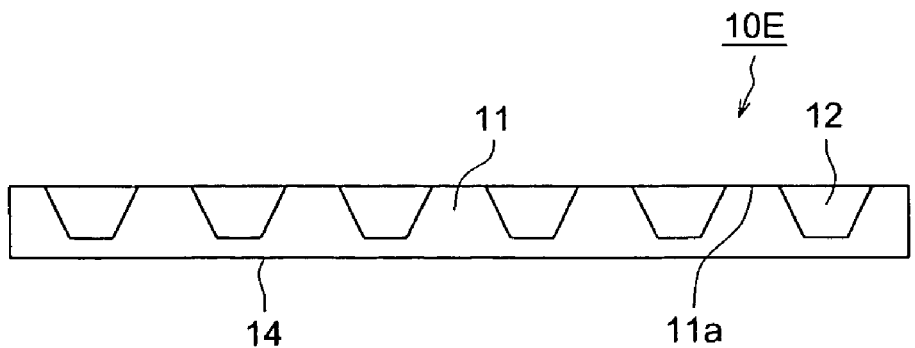
Figure 8:
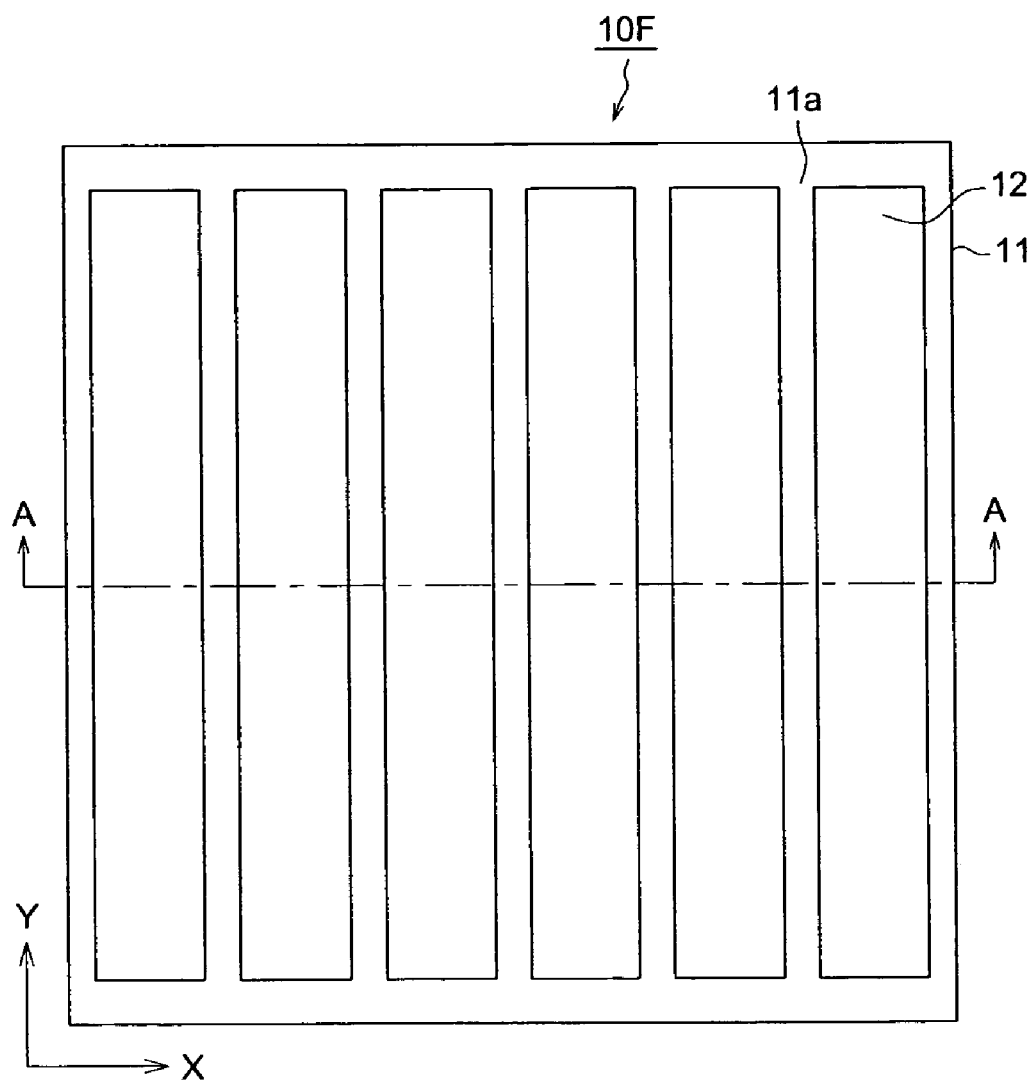
FIG. 8(A) is a plan view of the opposite side to the light emitting side surface of the light control sheet used for the surface light emitter according to the present invention.
FIG. 8(B) is a cross section view of the light control sheet of FIG. 8(A) along the line A-A.
Figure 8:
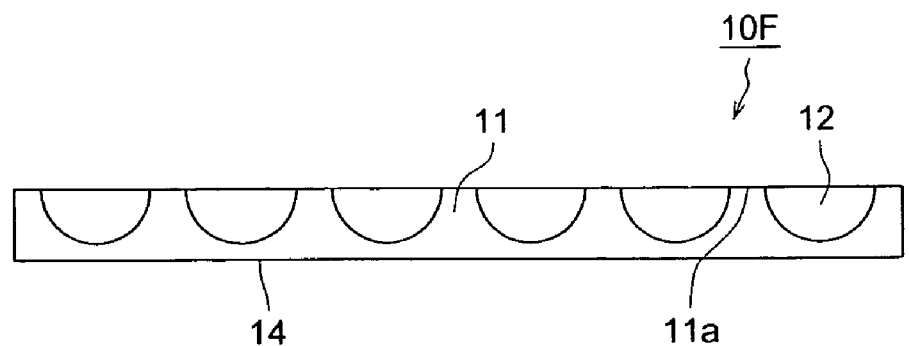

Then, when the surface light emitting device 20 is made emit light with the surface of the prism array sheet 10A, on which the square pyramid depressions 12 are formed, is adhered to the light emitting side surface 21 of the surface light emitting device 20 as above mentioned, the light is led into the prism array sheet without being totally reflected in an area where the flat surface 11a is contacted, the light which would be totally reflected at the light emitting side surface 21, if the prism array sheet 10A were not provided as shown in FIG. 3. Then, the large part of the light introduced into the prism array sheet 10A in this manner, is reflected on the inclined surface 12a of the depression 12, and this reflected light is introduced onto the emitting side surface 14 of the prism array sheet 10A and is emitted outside. Further, as shown in FIG. 3, even the light emitted from the emitting side surface 21 corresponding to the depression 12 of the prism array sheet 10A, even when the light is emitted in the vertical direction, the traveling direction is slightly changed on the inclined surface 12a of the depression 12, the light is emitted toward the front side, and the light emitted along the light emitting side surface is entered into the transparent substrate 11 as it is, is reflected on the inclined surface, and is also emitted from the front side.

Here, in order that the light, which is totally reflected without the light control sheet employed on the light emitting side surface 21 of the light emitting device 20, is introduced into the prism array sheet 10A through the flat surface 11a contacted to the light emitting side surface 21, it is preferable that the difference between the refractive index of this prism array sheet 10A and the refractive index of the light emitting side surface 21 of the surface light emitting device 20 is not greater than 0.2.

Further, when the square pyramid depressions 12 are provided on the prism array sheet 10A as described above, it is preferable that the inclination angle α of the inclination surface 12a of the depression 12 with respect to the light emitting side surface 21 of the surface light emitting device 20 is not less than 40° and not greater than 70°. If the inclination angle α is too small, even when the light, which is to be totally reflected by the light emitting side surface 21 of the surface light emitting device 20 if the prism sheet 10A is not employed, is introduced into the prism array sheet 10A, the light emitted through the emitting side surface is reduced. Because the light introduced into the prism array sheet 10A does not hit the inclination surface 12a of the depression 12 and then hit the emitting side surface 14 of the prism array sheet 10A to be totally reflected by the emitting side surface 14 of the prism array sheet 10A, and returns into the prism array sheet 10A. Further, when the inclination angle α is too large, the totally reflected light by the emitting side surface 14 of the prism array sheet 10A becomes large, and the emitting light is lowered.

Further, as the shape of the depression 12, other than the square pyramid, as shown in FIGS. 4(A) to 8(B), a triangular pyramid or circular cone, further, triangular pole and semi-circular pole which are laid down and arranged on the surface of the transparent substrate 11 are preferable. Other than them, even the shape in which the half circular ball like depression is formed, the shape of triangular pole like or half circular pole like is formed in such a manner that they are superimposed in the both directions of X and Y, is preferable. That is, the cross sectional shape of the depression when it is cut by a plane perpendicular to the surface of the transparent substrate, may be the shape of a triangle, or trapezoid, or arc like, and the front brightness can be improved.

Figure 9:
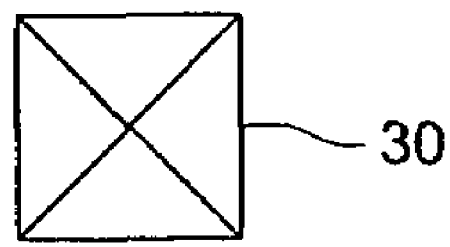
FIG. 9(A) is a plan view of a punch used when the light control sheet according to the present invention is manufactured.
FIG. 9(B) is a side view of the punch of FIG. 9(A).
Figure 9:
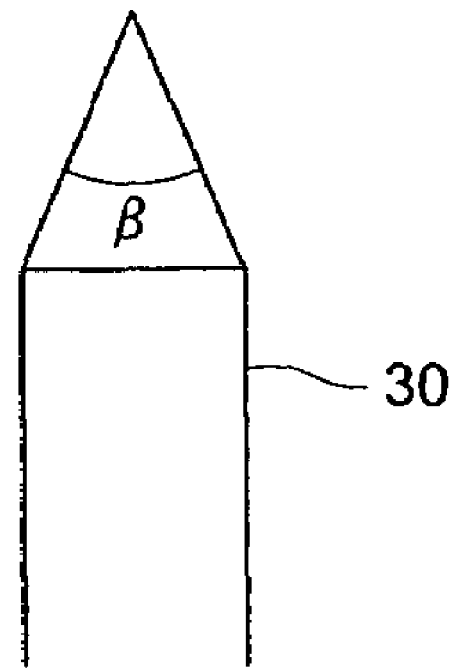

As the manufacturing method of the prism sheet array, by using the square pyramid punch 30 with the apex angle β shaped to fit the shape of the depression 12 as shown in FIGS. 9(A) and 9(B), a large number of depressions are marked on one surface of the transparent substrate 11, and the prism array sheet 10A having the depressions 12 can be made. Further, when the shape of the punch is changed into each kind of shape as shown in FIGS. 10(A-1) to 10(B-2), the shape of depression 12 of the prism array sheet can be changed.

As the material of the transparent substrate 11, the transparent resin sheet can be used. The film of the resin such as acrylic resin, polyester or polycarbonate can be used, however, it is not limited to them.

Hereupon, as the surface light emitting device 20, any device is available as long as it performs surface emission, and inorganic EL elements are available other than organic EL elements. However, it is particularly effective that the present invention is applied to the organic EL element, whose brightness can be greatly improved. This point is also the same for each of the following embodiments.

Further, in the present invention, the light control member 100 can be used for various light emitting elements other than the surface light emitting device, the light control member which is comprising the light control sheet having at least one surface having the depressions dotted on the flat surface and the transparent material, whose refractive index is lower than that of the light control sheet, arranged in the depressions to fill the depressions and make a flat surface. Combining various kinds of light emitting elements and the light control member 100 makes the efficiency better and is as effective for the brightness improvement as in case of the surface light emitting device. When such a light control member 100 and the light emitting element are combined, the strength of the light emitter as a whole is increased and becomes strong against the impact or the pressure from the outside.

Embodiment 2

In the second embodiment of the present invention, as the light control sheet, as shown in FIGS. 5(A), 5(B), the circular cone depressions 12 are provided on one surface of the transparent substrate as in the case of the embodiment 1, and the prism array sheet 10C, in which the depressions 12 are formed with space therebetween in the vertical and horizontal directions, is used.

Figure 11A:
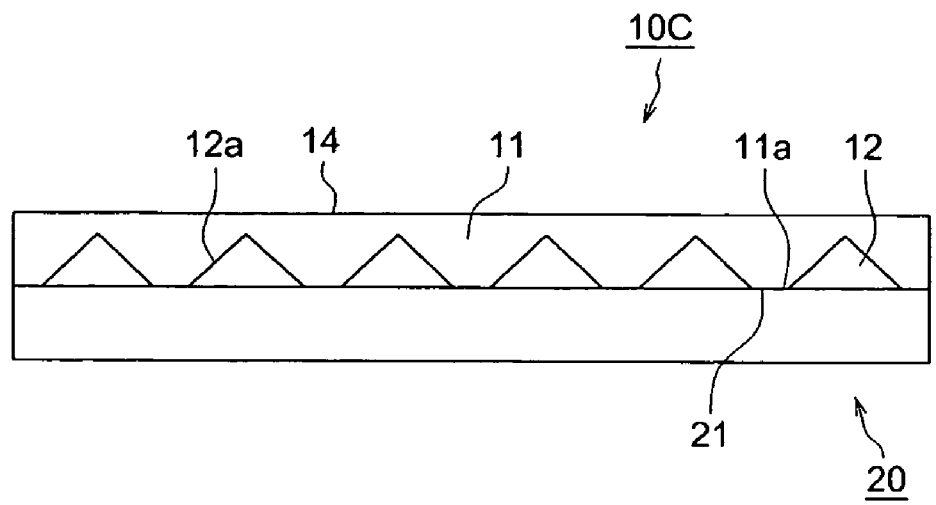
FIGS. 11(A) and 11(B) are general side views showing the surface light emitter according to the embodiment 2 of the present invention.
Figure 11B:
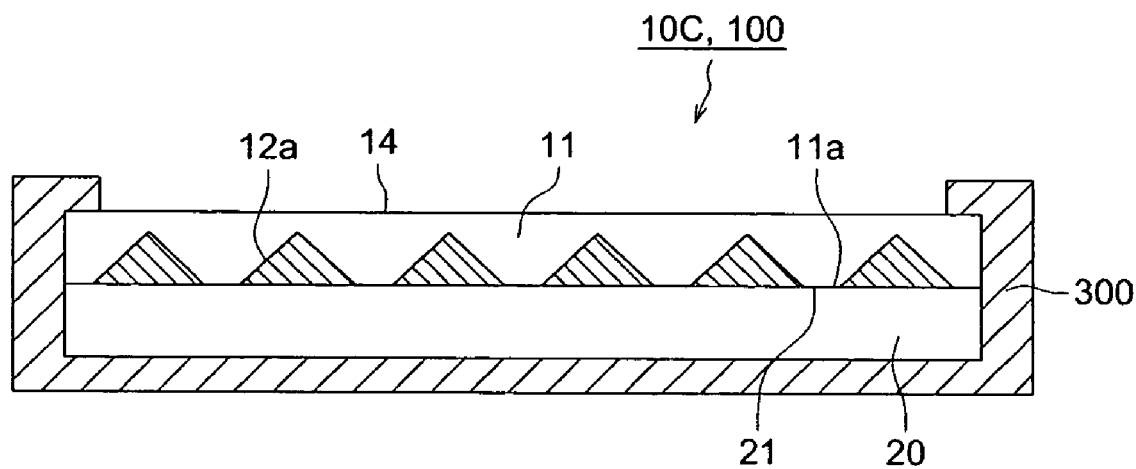

Then, also in the surface light emitter of this embodiment 2, as shown in FIG. 11(A), in the same manner as the case of the embodiment 1, the surface, on which the circular cone depressions 12 shown in the prism array sheet are formed, is adhered to the light emitting side surface 21 of the surface light emitting device 20, through which the light generated in the surface light emitting device 20 is emitted. Hereupon, in the same manner as in the embodiment 1, the light control member is previously made and then may also be adhered with the surface on which the depressions of the light control sheet faced to the light emitting side surface of the surface light emitting device. Further, as shown in FIG. 11(B), the prism array sheet 10C or the light control member 100 and surface light emitting device 20 are nipped by the nipping member 300 at the outer peripherals of them to make them stick together.

Figure 12:
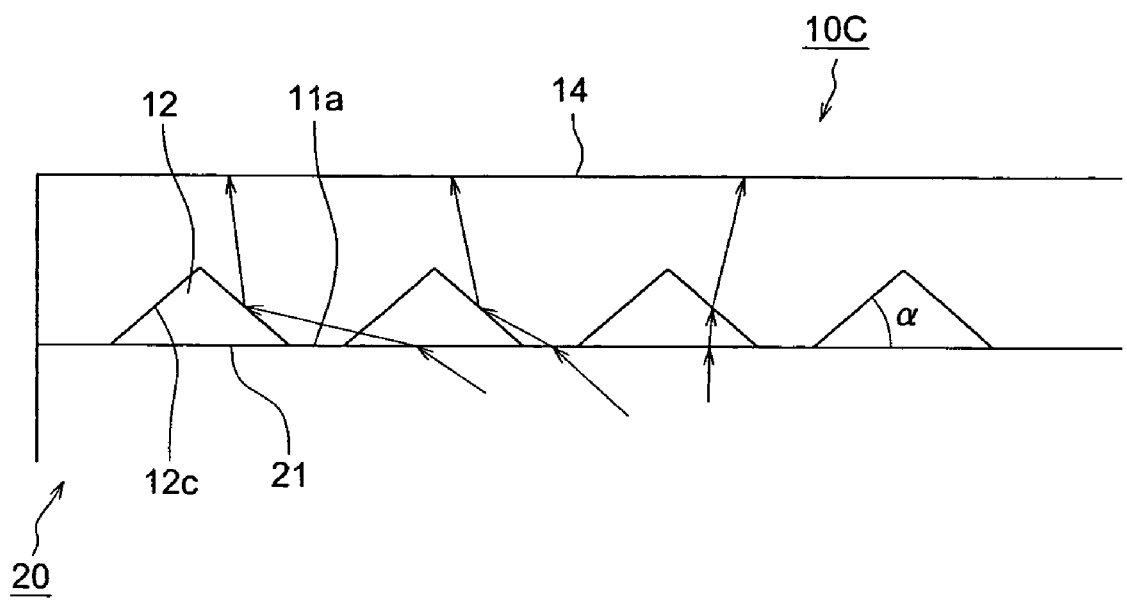
FIG. 12 is a partial enlargement explain view of the surface light emitting device according to the embodiment 2 of the present invention.

When conducted in this manner, also in the surface light emitter of the embodiment 2, as shown in FIG. 12, the light, which is to be totally reflected by the light emitting side surface 21 of the surface light emitter 20 if the light control sheet is not provided, is introduced into the prism array sheet 10C in the same way as the surface light emitter of the embodiment 1. The large part of the light introduced into the prism array sheet 10C in this manner is reflected by the inclined surface 12c of the depression 12, and the reflected light is introduced onto the emitting side surface 14 of the prism array sheet 10C and is emitted outside. Further, as shown in FIG. 12, of the light emitted from the light emitting side surface 21 corresponding to the depression 12 of the prism array sheet 10C, the light emitted in the perpendicular direction is emitted through the front side although the traveling direction of the light is little changed on the inclination surface 12a of the depression 12, and the light emitted along the light emitting side surface 21 is entered into the transparent substrate 11 as it is, is reflected by the inclined surface 12a and is also emitted through the front side.

Herein, in the case where, as described above, the depressions 12 in the prism array sheet 10C are provided in the vertical and horizontal directions in such a manner that they are respectively spaced, when the interval between the depressions 12 becomes narrow, and area of the flat surface 11a becomes small, more of the light introduced into the flat surface 11a is introduced into the inclined surface 12c of the depression 12 and scattered, and the amount of the light totally reflected on the light emitting side surface 21 of the surface light emitting device 20 becomes large. When the interval between the depressions 12 becomes wide and the area of the flat surface 11a becomes large, the amount of the light entered into the prism array sheet 10C from the light emitting side surface 21 of the surface light emitting device 20 becomes large, however, the amount of the light reflected by the inclined surface of the depressions 12 toward the front side becomes small. Therefore, it is preferable that the ratio occupied by the flat surface in the total surface area is within a range from 0.125 to 0.8.

As the manufacturing method of the prism array sheet 10C in the embodiment 2, a metallic mold is made, and then the prism array sheet can be manufactured as moldings.

The manufacturing method of the prism array sheet 10C using the metallic mold will be shown in the following.

Figure 13:
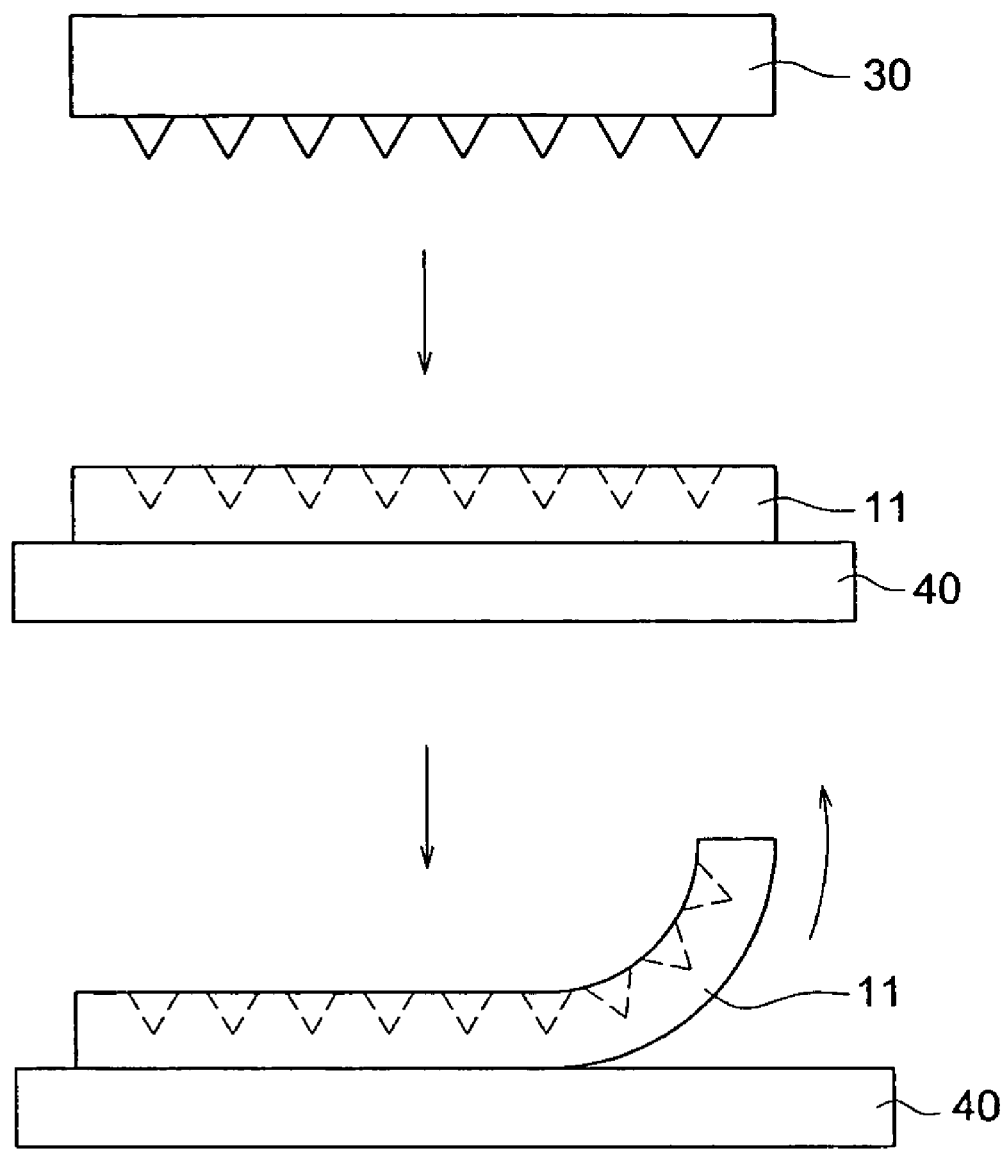
FIG. 13 is a general explain view showing the manufacturing method of the surface light emitter according to the embodiment 2 of the present invention.

Initially, the resist film is coated with a predetermined thickness on the substrate, and exposure is conducted by the mask in which many circular holes are arranged, after that, when the resist film on the substrate is developed, the film having the circular cone depressions can be formed on the substrate. The nickel electro-casting film is formed on this film by the electro-casting method, and the conical convex nickel die is made. Next, when this nickel die 30 is pressed onto the transparent substrate 11 formed of the transparent resin made on the substrate 40 as shown in FIG. 13, the circular cone depression 12 is molded on the surface of the transparent substrate 11. In this case, the transparent resin which is the transparent substrate 11 may also be heated, and softened. After that, the transparent substrate is peeled from the substrate 40, and the prism array sheet 10C can be made.

When thus manufactured prism array sheet 10C is adhered to the surface light emitting device 20 similar to the embodiment 1, the surface light emitter can be made.

Further, in the present embodiment, as shown in FIG. 5(B), the prism array sheet 10C whose thickness is greater than the depth of the depression 12 is manufactured, however, it is preferable that the depth is the same as the thickness of the prism array sheet 10C. In this case, because the inclination surface 12a can be formed across the whole of the thickness of the prism array sheet 10C, the light entered into the prism array sheet 10C can be effectively reflected toward the front direction. Accordingly, the prism array sheet whose film thickness is thinner, and whose front brightness is higher, can be made. And the thickness of the surface light emitter can be made thinner, and it is preferable for the weight reduction.

Further, in the case where the thickness of the prism array sheet and the height of the depression 12 are made the same, there are sometimes opened holes in the emitting side surface 14 of the prism array sheet when the prism array sheet is made, however, it is known that when the opening rate of the holes is less than 10% of the surface area of the emitting side surface 14, there is almost no lowering of the front brightness, and the good brightness can be maintained.

Embodiment 3

Figure 14:
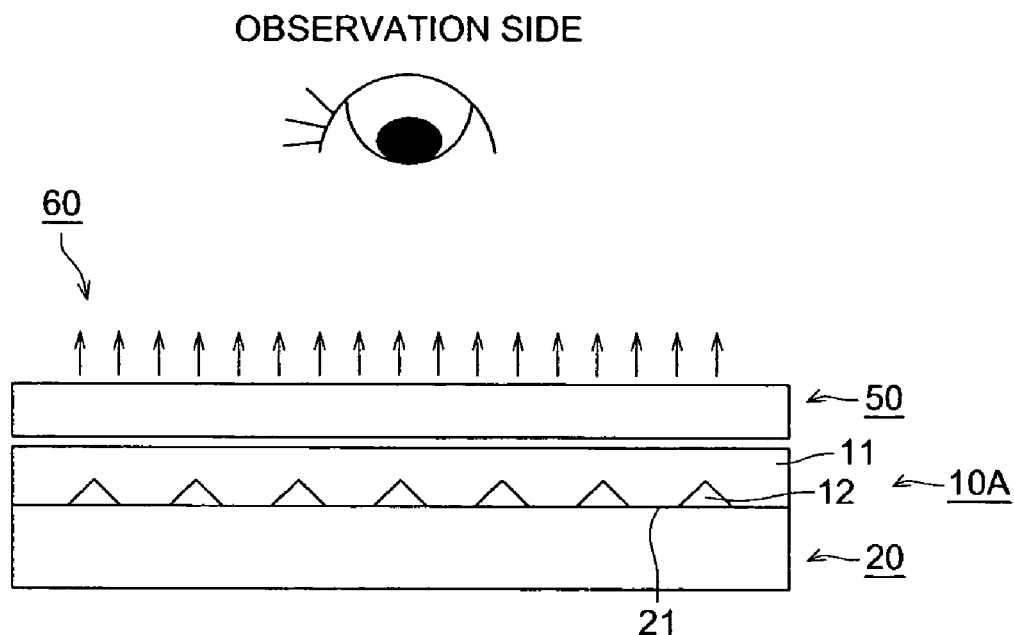
FIG. 14(A) is a cross section view showing a structure of a display apparatus according to the embodiment 3 of the present invention.
FIG. 14(B) is a plan view showing a structure of a display apparatus according to the embodiment 3 of the present invention.
Figure 14:
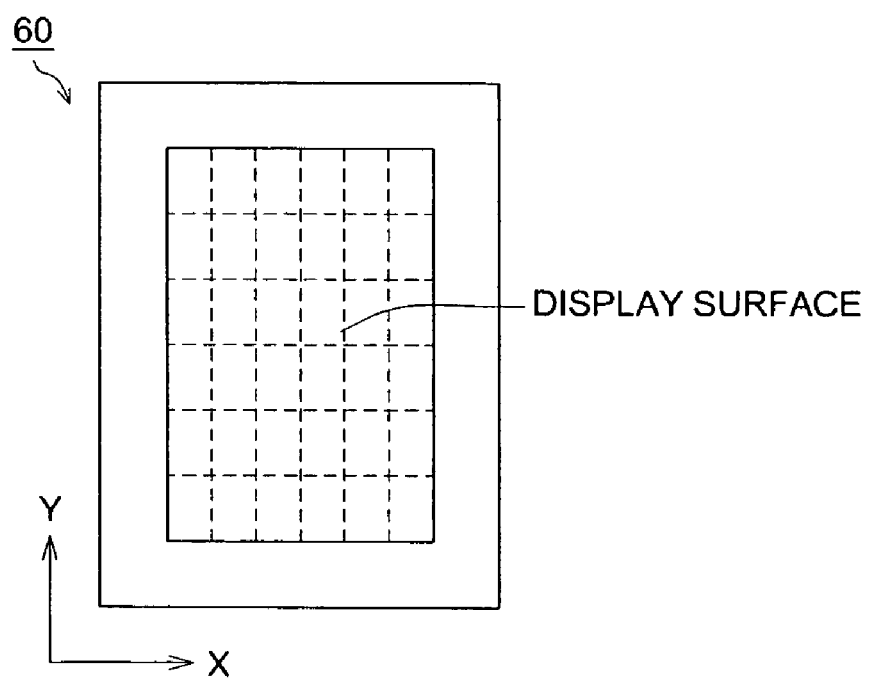

In FIGS. 14(A), 14(B), a display apparatus 60 which is the third embodiment of the present invention is shown. This display apparatus 60 is structured by the surface light emitter 20 having either (herein, the structure of the first embodiment is shown) of the structures described in the first and the second embodiment and a light modulation element 50. As the light modulation element 50, a transmissive type or semi-transmissive type liquid crystal display element is adopted, the liquid crystal display element in which a liquid crystal layer is disposed between a pair of transparent substrates on which the transparent electrodes are respectively formed. Herein, the surface light emitter 20 is used as a backlight of the light modulation element 50. The light emitted from the surface light emitter 20 to the light modulation element 50 is modulated when the light modulation element is switched in a pixel unit by a drive circuit, and is recognized as an image to the observer, in an example shown in FIGS. 14(A), 14(B), the shape of the depression of the light control sheet of the surface light emitter is made square pyramid.

Embodiment 4

Figure 15:
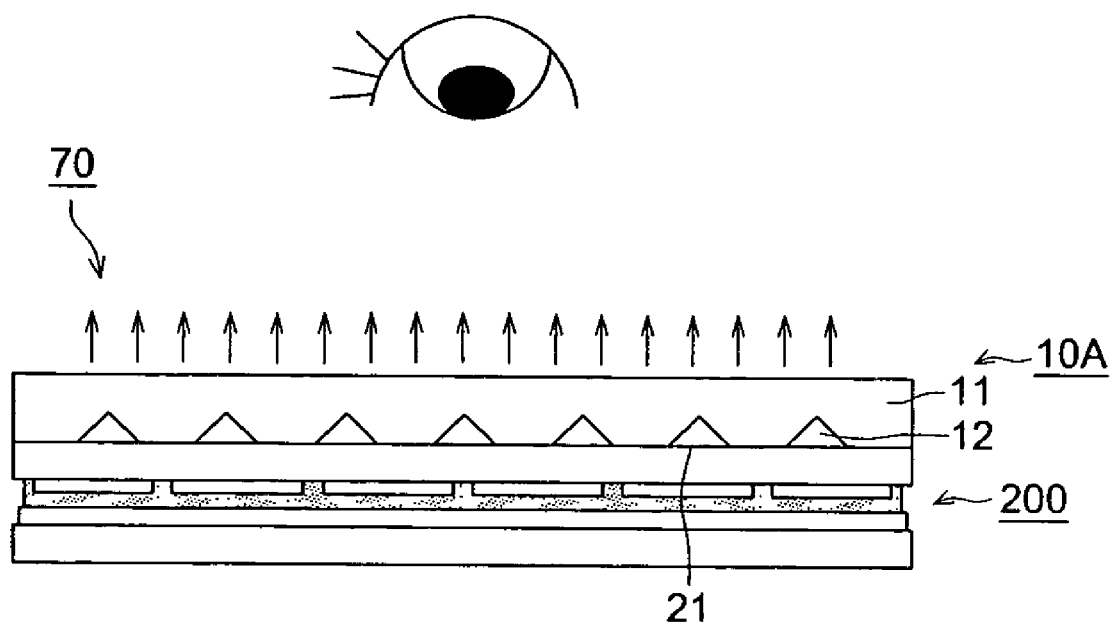
FIG. 15 is a cross section view showing a structure of a display apparatus according to the embodiment 4 of the present invention.

In FIG. 15, a display apparatus 70 which is the fourth embodiment of the present invention is shown. The display apparatus 70 employs a display device as a surface light emitting device, the display device which is made to display arbitrary images by patterning at least one of a transparent electrode or an opposing electrode of the organic EL element 200 to make a matrix of pixels. In the surface light emitter, the flat part of the surface, on which the depressions of the light control sheet having either (herein, the structure of the first embodiment is shown) of the structures described in the first and the second embodiment are formed, is adhered to the light emitting side surface of the surface light emitting device 200. Such a display apparatus is appropriate for the use of comparatively large-scale display in a public location such as a display provided with large pixels.

Further, as a product method of the depressions of the light control sheet, in the case of producing arc like depressions, the arc like projections are formed as a die by dropping hardening resin on the substrate, and after the resin is hardened by the light and heat, the depressions can be molded by pressing the die against a transparent resin sheet as in the second embodiment. Other than that, as the forming method of the square pyramid like depressions, a mask which has a lot of rectangular holes is closely contacted to a wafer such as silicon, the wafer is dry-etched by using the reactive gas, the square pyramid like depressions are formed by using the anisotropy of the crystal orientation of the wafer, the metallic die having the square pyramid like projections is made by using the electro-casting method, and the light control sheet having the square pyramid depressions can be made by this die. As the producing method, it is not limited to this, any method can be used as long as it is generally well-known and can form a predetermined shape.

According to the embodiment of the present invention, the light control sheet, at least on one surface of which depressions are provided, is adhered to the light emitting side surface of the surface light emitting device with the surface of the light control sheet having the depressions being closely contacted to the light emitting side surface of the surface light emitting device, and transparent material whose refractive index is lower than that of the light control sheet is disposed in the space between the depressions and the light emitting side surface of the surface light emitting device. When conducted in this manner, when the light control sheet is provided so that the concave and convex are on the emitting side of the surface light emitting device, the light, which is to be totally reflected by the light emitting side surface of the surface light emitting device if the light control sheet is not provided, is not totally reflected by the part where the surface of the light control sheet having the depressions is adhered, and introduced into the light control sheet. Then, the large part of the light introduced into the light control sheet in this manner is reflected by the interface of the space of the depressions formed toward the light emitting side surface of the surface light emitting device, and the reflected light is introduced into the emitting side surface of the light control sheet, and emitted outside. As the result, the front brightness of the light emitted through the light control sheet is largely improved. Further, when the light control member is used, in which the transparent material whose refractive index is lower than that of the light control sheet is previously arranged in the depression of the light control sheet, it can be easier to stick the light control member to the surface light emitting device, and the productivity can be improved.

EXAMPLE

Next, the surface light emitter according to the example of the present invention and the surface light emitter of the comparative example are compared, and in the surface light emitter according to the example of the present invention, the fact will be made clear that the front brightness of the light emitted from the surface light emitter is largely improved.

Example 1

In the example 1, as shown in the embodiment 1 (refer to FIGS. 1(A) to 2(B)), the prism array sheet 10A is used, in which the square pyramid like depressions 12 are vertically and horizontally continuously formed on one surface of the transparent substrate 11, and the flat surface 11a in the prism array sheet 10A is adhered to the light emitting side surface 21 of the surface light emitting device 20 formed of the organic EL element. As the organic EL element, so called a bottom emission type organic EL element is used, in which a transparent anode is formed on the upper surface of the transparent substrate, and on the upper surface of this anode, organic EL layer is provided, and the light is emitted toward the transparent substrate. On the upper surface of the anode, a positive hole conveyance layer is provided. Further, on the upper surface of the positive hole conveyance layer, the light emitting layer is provided, and on its upper surface, a positive hole blocking layer is provided. As the transparent substrate, no-alkaline glass (the thickness 0.7 mm, size 40 mm×52 mm) is used, and 150 nm ITO film is formed on it, patterning of the electrode is conducted by the general photo-lithography method. The resistance of the anode in this case is measured as 20 $\Omega/cm^2$ by using MITSUBISHI KAGAKU Co. made RORESTA. Further, the dimension of the anode is 35×46 mm. As the positive hole conveyance material, triazole derivative is used, and the positive hole conveyance layer of the thickness of 100 nm is formed on the upper surface of the thin anode by the vacuum evaporation processing method. As the light emitting layer, tris (8-quinolirate)aluminum is formed with the thickness of 100 nm by the vacuum evaporation method. As the positive hole blocking layer, triazine derivative is formed with the thickness of 100 nm by the vacuum evaporation method. As the electron conveyance layer, nitration fluorene derivative is formed with the thickness of 100 nm by the vacuum evaporation method. As a cathode, aluminum is formed with the thickness of 100 nm by the spattering method. The refractive index of the surface light emitting device 20 on the light emitting side surface 21 is 1.517.

Figure 16A:
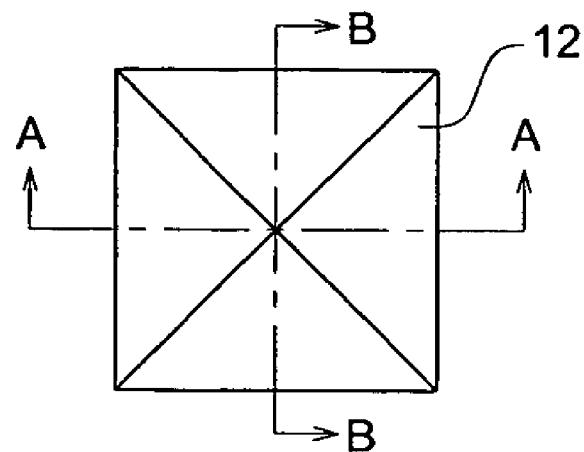
FIG. 16(A) is a plan view showing a general shape of a depression of an example 1.
Figure 16B:
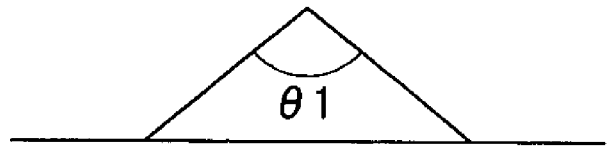
FIG. 16(B) is a cross section view of a depression of FIG. 16(A) along the line A-A.
Figure 16C:
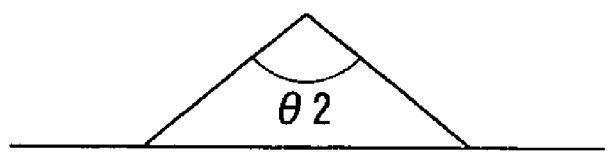
FIG. 16(C) is a cross section view of a depression of FIG. 16(A) along the line B-B.

Hereupon, the refractive index of this prism array sheet 10A is 1.5185 at the wavelength of 550 nm, and the apex angle θ of the square pyramid like depression 12 is, as shown in FIGS. 16(B), 16(C), θ1 and θ2 are both 50°, and the pitch in the vertical and the horizontal direction of the depression 12 is 0.05 mm. The thickness of the prism array sheet 10A is 0.15 mm, and the depth of the depression 12 is 0.044 mm.

Example 2

In the example 2, other than that the depth of the depression 12 of the prism array sheet 10A is 0.049 mm, it is produced in the same way as the example 1.

Example 3

In the example 3, other than that the apex angle θ of the depression 12 is 45°, and the height of the depression 12 of the prism array sheet 10A is 0.039 mm, it is produced in the same way as the example 1.

Example 4

In the example 4, other than that the shape of the depression 12 is the same as the conical prism array sheet 10C, and its apex angle is made 50°, and the height is 0.319 mm, it is produced in the same way as the example 1.

Example 5

In the example 5, other than that the depth of the depression 12 is made 0.0533, it is produced in the same way as the example 4.

Example 6

In the example 6, other than that the depth of the depression 12 is made 0.0426, it is produced in the same way as the example 4.

Example 7

Figure 17:
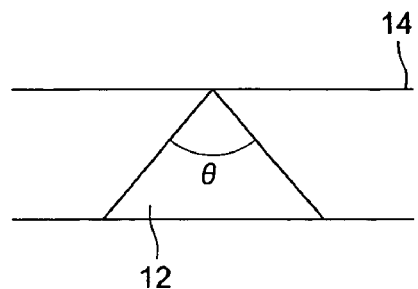
FIG. 17 is a general view showing the shape of a depression of an example 7.

In the example 7, as shown in FIGS. 6(A), (B), the prism array sheet 10D is used, in which the depression 12 the shape of which is laid-down triangular poles continuously arranged horizontally on one surface of the transparent substrate 11, and the apex angle θ of the depression 12 is 50° as shown in FIG. 17, and the pitch of the horizontal direction is made 0.05 mm. The thickness of the prism array sheet 10D is 0.035 mm, and the depth of the depression is 0.035 mm. In this case, there is no hole opened on the emitting side surface 14 of the prism array sheet 10D.

Example 8

Figure 18:
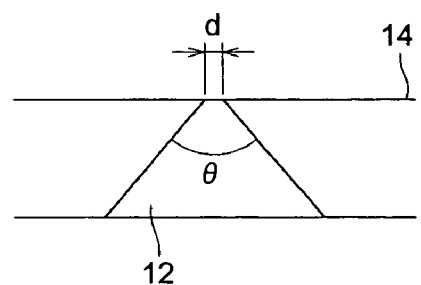
FIG. 18 is a general view showing the shape of a depression of an example 8.

In the example 8, as shown in FIG. 18, on the emitting side surface 14, fine rectangular holes of the width d are opened, its aperture area is 5% of the total area of the emitting side surface 14, and the thickness of the prism array sheet 10D is 0.033, and the other than that, it is produced in the same manner as the example 7.

Example 9

In the example 9, other than that the thickness of the prism array sheet 10A is made 0.044 mm, which is the same as the depth of the depression 12, it is produced in the same manner as the example 1.

Example 10

Figure 19:
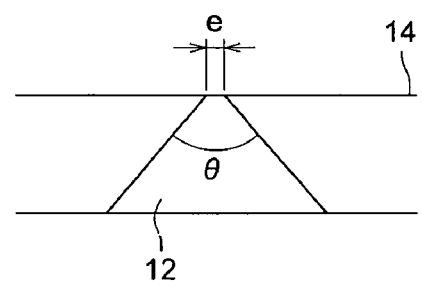
FIG. 19 is a general view showing the shape of a depression of an example 10.

In the example 10, as shown in FIG. 19, on the emitting side surface 14, the fine rectangular holes of width e are opened, and its aperture area is 2% of the total area of the emitting side surface 14, and the thickness of the prism array sheet 10D is 0.04 mm, and the depth of the depression 12 is made 0.04 mm, and other than that, it is produced in the same manner as the example 9.

Example 11

In the example 11, other than that the thickness of the prism array sheet 10C is 0.053 mm, and the depth of the depression is made 0.053 mm, it is produced in the same manner as the example 4.

Example 12

Figure 20:
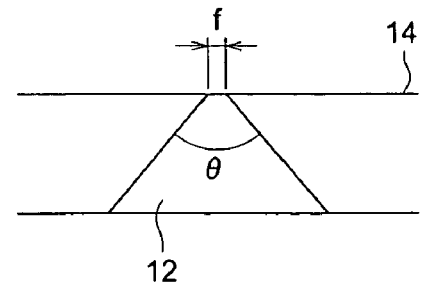
FIG. 20 is a general view showing the shape of a depression of an example 12.

In the example 12, as shown in FIG. 20, other than that on the emitting side surface 14, fine circular holes of diameter f are opened, and its aperture area is 1% of the total area of the emitting side surface 14, and the thickness of the prism array sheet 10C is 0.048 mm, and the depth of the depression 12 is made 0.048 mm, it is produced in the same manner as the example 11.

Example 13

In the example 13, as shown in FIG. 20, on the emitting side surface 14, fine circular hole of diameter f are opened, and its aperture area is 5% of the total area of the emitting side surface 14, and the thickness of the prism array sheet 10C is 0.04 mm, and the depth of the depression 12 is made 0.04 mm, it is produced in the same manner as the example 11.

Example 14

In the example 14, as shown in FIG. 20, other than that on the emitting side surface 14, fine circular holes of diameter f are opened, and its aperture area is 10% of the total area of the emitting side surface 14, and the thickness of the prism array sheet 10C is 0.034 mm, and the depth of the depression 12 is made 0.034 mm, it is produced in the same manner as the example 11.

Example 15

In the example 15, as shown in FIG. 20, other than that on the emitting side surface 14, fine circular holes of diameter f are opened, and its aperture area is 15% of the total area of the emitting side surface 14, and the thickness of the prism array sheet 10C is 0.03 mm, and the depth of the depression 12 is made 0.03 mm, it is produced in the same manner as the example 11.

Example 16

In the example 16, the shape of the depression 12 is the same as the conical prism array sheet 10C as shown in FIGS. 5(A), 5(B), 5(C), and the refractive index of this prism array sheet 10C is 1.8119 at the wavelength of 550 nm, and the apex angle θ of the depression is 40°, and the depth is 0.048 mm, and the light control member is used, in which the ultraviolet hardening resin of the refractive index 1.510 is filled in the depression, and other than that, it is produced in the same manner as the example 1.

Comparative Example 1

Figure 21:
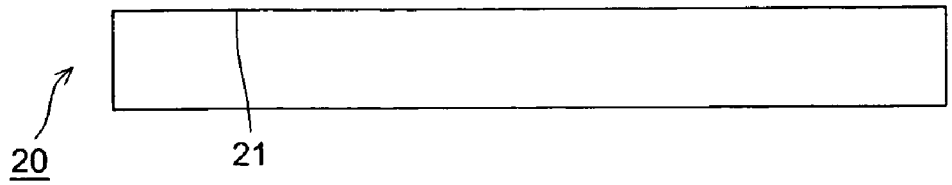
FIG. 21 is a side view of the surface light emitting device of a comparative example 1.

In the comparative example 1, the surface light emitting device 20 used in the example 1 is used as shown in FIG. 21 as it is, as the surface light emitter.

Comparative Example 2

Figure 22:
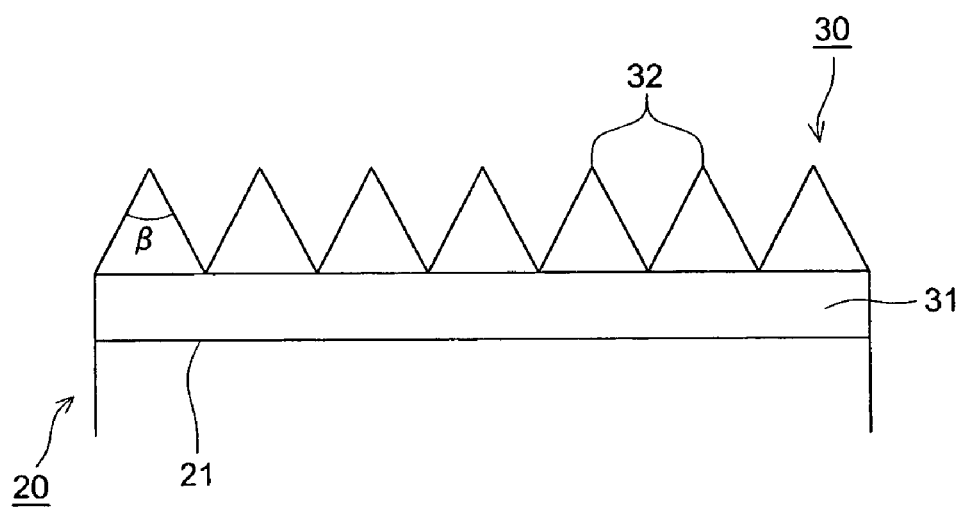
FIG. 22 is a side view of the surface light emitter of the comparative example 2.
Figure 23:
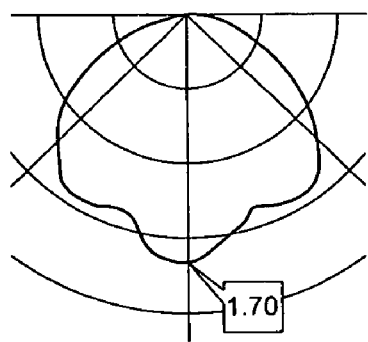
FIG. 23 is a view showing the light distribution characteristic of the surface light emitter of an example 1.
Figure 24:
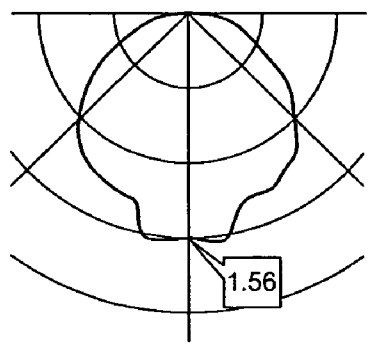
FIG. 24 is a view showing the light distribution characteristic of the surface light emitter of an example 2.
Figure 25:
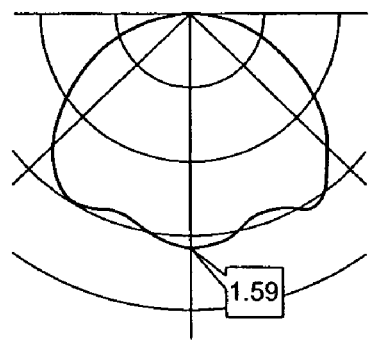
FIG. 25 is a view showing the light distribution characteristic of the surface light emitter of an example 3.
Figure 26:
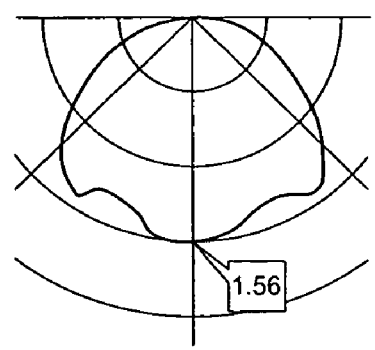
FIG. 26 is a view showing the light distribution characteristic of the surface light emitter of an example 4.
Figure 27:
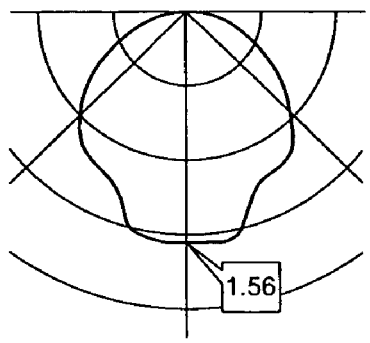
FIG. 27 is a view showing the light distribution characteristic of the surface light emitter of an example 5.
Figure 28:
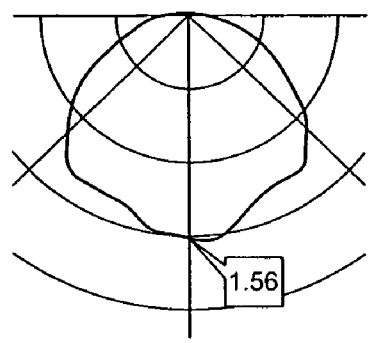
FIG. 28 is a view showing the light distribution characteristic of the surface light emitter of an example 6.
Figure 29:
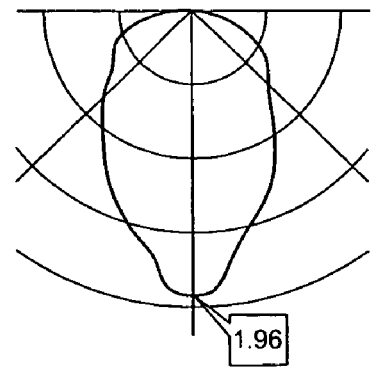
FIG. 29 is a view showing the light distribution characteristic of the surface light emitter of an example 7.
Figure 30:
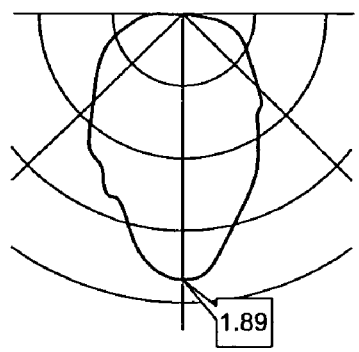
FIG. 30 is a view showing the light distribution characteristic of the surface light emitter of an example 8.
Figure 31:
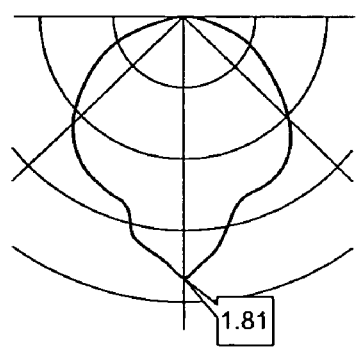
FIG. 31 is a view showing the light distribution characteristic of the surface light emitter of an example 9.
Figure 32:
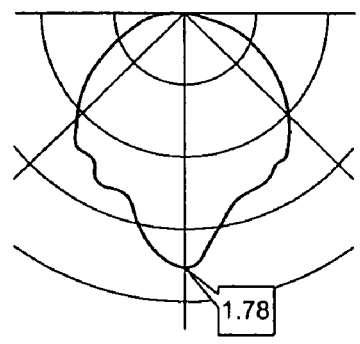
FIG. 32 is a view showing the light distribution characteristic of the surface light emitter of an example 10.
Figure 33:
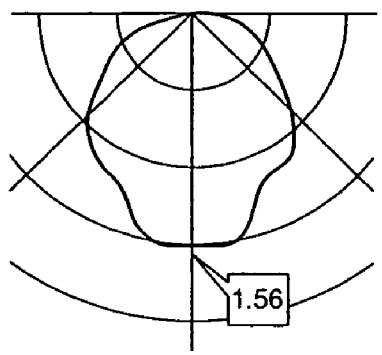
FIG. 33 is a view showing the light distribution characteristic of the surface light emitter of an example 11.
Figure 34:
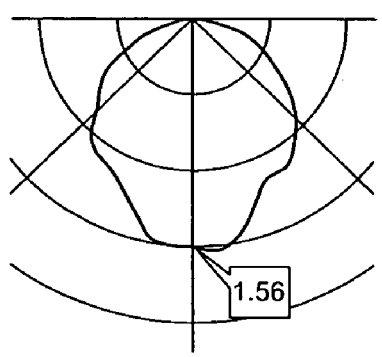
FIG. 34 is a view showing the light distribution characteristic of the surface light emitter of an example 12.
Figure 35:
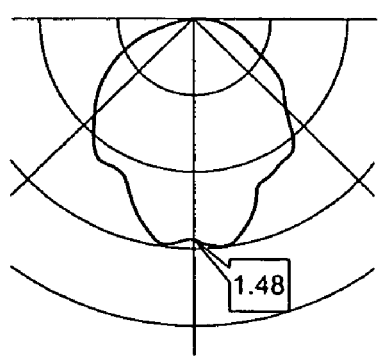
FIG. 35 is a view showing the light distribution characteristic of the surface light emitter of an example 13.
Figure 36:
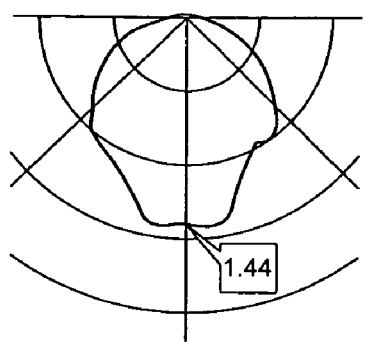
FIG. 36 is a view showing the light distribution characteristic of the surface light emitter of an example 14.
Figure 37:
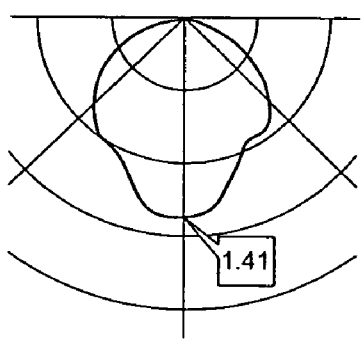
FIG. 37 is a view showing the light distribution characteristic of the surface light emitter of an example 15.
Figure 38:
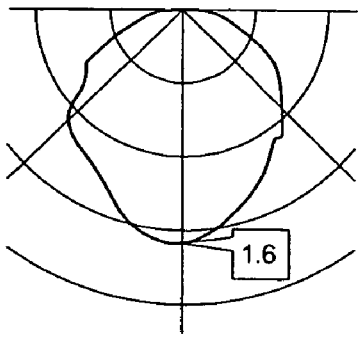
FIG. 38 is a view showing the light distribution characteristic of the surface light emitter of an example 16.

In the comparative example 2, as shown in FIG. 22, the light control sheet 30, in which the triangular pole like depression 32 is continuously formed on one surface of the transparent substrate 31, is used, and the triangular projections 31 in this light control sheet 30 are made opposite side to the emitting side surface 21 of the surface light emitting device 20 of the example 1, and this light control sheet 30 is adhered to the emitting side surface 21 of the surface light emitting device 20. Hereupon, the refractive index of this light control sheet 30 is 1.495, and the apex angle β of the triangular pole like projections 31 is 90°, and when the pitch of the triangular pole like depression 31 is supposed as 1, the thickness of the transparent substrate 31 is 2.6.

Then, the surface light emitting devices in each surface light emitters of the above examples 1-16 and the comparative examples 1, 2 are made emit light, and the light distribution characteristic in respective surface light emitters is checked, and together with that, when the front brightness of the surface light emitter of the comparative example 1 is supposed as 1, the front brightness of each surface light emitter is measured. Hereupon, the light distribution characteristic is measured by the angle—brightness measuring device (Precise gauge (Co.) made organic EL light emitting efficiency measuring device EL 1003) in the way that the brightness in the direction having a predetermined angle, with respect to the normal line, in the surface including the normal line direction is measured while the angle is being changed.

Figure 39:
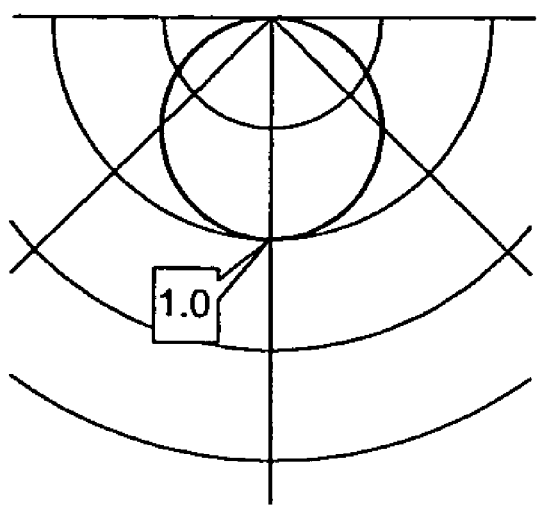
FIG. 39 is a view showing the light distribution characteristic of the surface light emitter of a comparative example 1.
Figure 40:
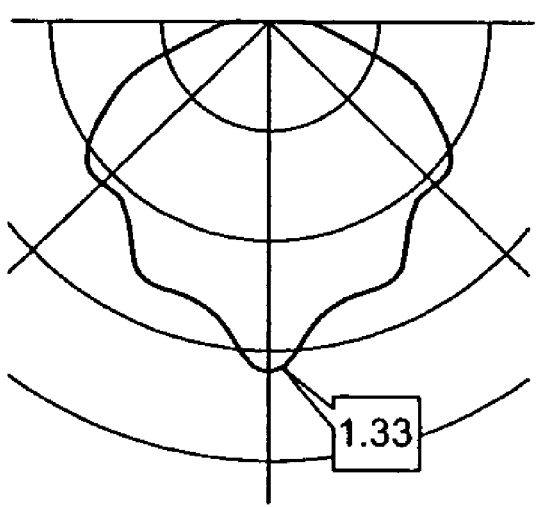
FIG. 40 is a view showing the light distribution characteristic of the surface light emitter of a comparative example 2.

Then, the result of examples 1-16 shown in order of examples 1-16 in FIGS. 23-38, the result of the comparative example 1 is shown in FIG. 39, and the result of the comparative example 2 is shown in FIG. 40. Hereupon, the figures in FIGS. 23-38 indicate the brightness in X direction. Herein, the maximum brightness in the range of ±15° from the front direction is taken as the front brightness, where the front brightness is a relative brightness with respect to a front brightness (supposed as 1) without the light control sheet, and the front brightness is shown in each drawing.

As the result, it can be seen that the front brightness in each of the surface light emitters of example 1-16 is more improved than the front brightness in the surface light emitters of the comparative examples 1, 2. Further, in examples 7-15, when the depth of the depression is made about the same value as the thickness of the light control sheet, it is seen that the front brightness is higher, and it is seen that there is no large influence on the front brightness even when a slight hole is opened on the emitting side surface of the light control sheet.

Example 17

In the example 17, by using the surface light emitter 20 produced in the same manner as the example 1, and the liquid crystal display element 50, the display apparatus 60 of the structure shown in FIGS. 14(A), 14(B), is produced. The liquid crystal display element 50 is the transmissive type in which the liquid crystal layer is disposed between a pair of the transparent substrates on which transparent electrodes are formed on each of the substrates. The light emitted from the surface light emitter as the backlight is emitted to the liquid crystal display element 50 provided on the observation side. The light entered into the liquid crystal display element 50 is modulated by the liquid crystal layer, in a pixel unit, is switched by a drive circuit not shown, and is recognized as an image by the observer. Herein, the light distribution characteristic of the light emitted from the surface light emitter is the light distribution characteristic in FIG. 23. This light distribution characteristic shows the same feature after passing the liquid crystal display element. As described above, when the light control sheet having the depressions is used, the display apparatus having the light distribution characteristic with a high front brightness which is required for displays can be provided.

What is claimed is:
1. A surface light emitter, comprising:
   a surface light emitting device which has a light emitting side surface, through which the surface light emitting device emits light; and
   a light control sheet which has a surface on which a plurality of depressions and a flat portion between the depressions are provided, the light control sheet being mounted on the light emitting device, with the flat portion being bonded to the light emitting side surface, wherein transparent material fills the depressions, and a refractive index of the transparent material is lower than a refraction index of the light control sheet.

2. The surface light emitter of claim 1, wherein a shape of a longitudinal section of the depressions is a triangle, a trapezoid or an arc.

3. The surface light emitter of claim 1, wherein a depth of the depressions is the same as a thickness of the light control sheet.

4. The surface light emitter of claim 1, wherein the transparent material is air.

5. The surface light emitter of claim 1, wherein the transparent material is ultraviolet curable resin.

6. A display apparatus, comprising:
a transmissive display device; and
a surface light emitter, the surface light emitter including:
  a surface light emitting device which has a light emitting side surface, through which the surface light emitting device emits light; and
  a light control sheet which has a surface on which a plurality of depressions and a flat portion between the depressions are provided, the light control sheet being mounted on the light emitting device with the flat portion being bonded to the light emitting side surface, wherein transparent material fills the depressions,
  a refractive index of the transparent material being lower than a refraction index of the light control sheet, and the surface light emitter functions as a backlight.

7. A display apparatus, comprising:
a surface light emitting device which has a matrix of a plurality of pixels arranged in a plane for emitting light;
a light control sheet which has a surface on which a plurality of depressions and a flat portion between the depressions are provided, the light control sheet being mounted on the light emitting device with the flat portion being bonded to the light emitting side surface,
wherein transparent material fills the depressions, and a refractive index of the transparent material is lower than a refraction index of the light control sheet.

8. A light control member, comprising:
a light control sheet which has a surface on which a plurality of depressions and a flat portion between the depressions are provided; and
transparent material fills the depressions to make a flat surface, and a refractive index of the transparent material is lower than a refractive index of the light control sheet.

9. The light control member of claim 8, wherein a shape of a longitudinal section of the depressions is a triangle, a trapezoid or an arc.

10. The light control member of claim 8, wherein a depth of the depressions is the same as a thickness of the light control sheet.

11. The light control member of claim 8, wherein the transparent material is ultraviolet curable resin.

12. A surface light emitter, comprising:
a surface light emitting device which has a light emitting side surface, through which the surface light emitting device emits light; and
a light control member, the light control member including:
  a light control sheet which has a surface on which a plurality of depressions and a flat portion between the depressions are provided, the light control sheet being mounted on the light emitting device with the flat portion bonded to the light emitting side surface; and
  transparent material fills the depressions to make a flat surface, and a refractive index of the transparent material is lower than a refraction index of the light control sheet.

13. The surface light emitter of claim 12, wherein a shape of a longitudinal section of the depressions is a triangle, a trapezoid or an arc.

14. The surface light emitter of claim 12, wherein a depth of the depressions is the same as a thickness of the light control sheet.

15. The surface light emitter of claim 12, wherein the transparent material is air.

16. The surface light emitter of claim 12, wherein the transparent material is ultraviolet curable resin.

* * * * *